Figure 1:
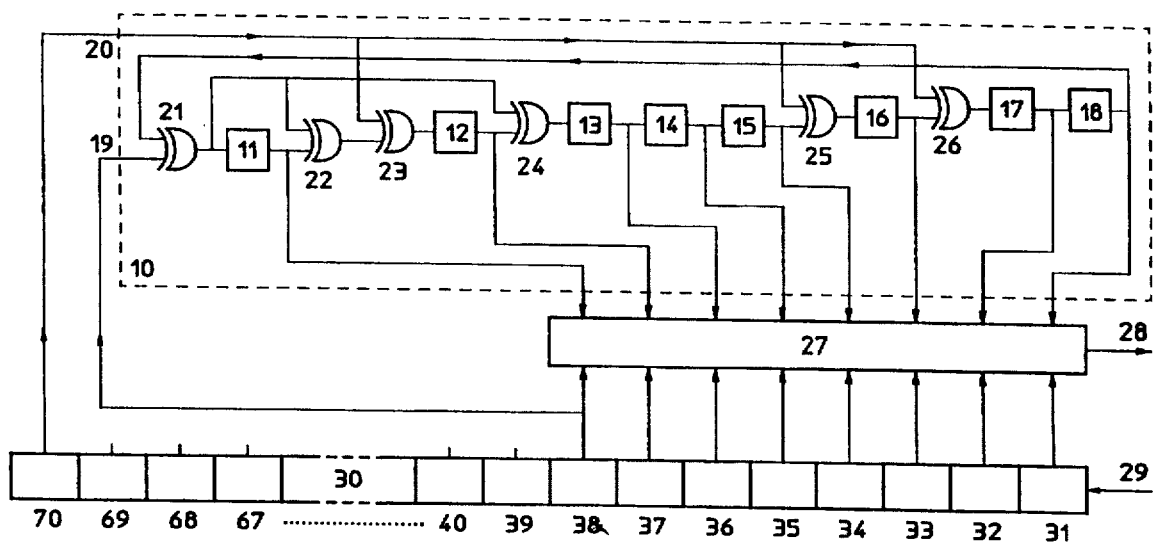

United States Patent [19]

Nielander et al.

[11] Patent Number: 5,724,034
[45] Date of Patent: Mar. 3, 1998

[54] DEVICE FOR ESTABLISHING CELL BOUNDARIES IN A BIT STREAM AND CRC CALCULATION

[75] Inventors: Johan Wieant Gerlach Nielander, Amersfoort; Franciscus Anna Gerardus Vankan, Tilburg, both of Netherlands

[73] Assignee: Koninklijke PTT Nederland N.V., Groningen, Netherlands

[21] Appl. No.: 663,140

[22] PCT Filed: Dec. 23, 1994

[86] PCT No.: PCT/EP94/04272

§ 371 Date: Jun. 18, 1996

§ 102(e) Date: Jun. 18, 1996

[87] PCT Pub. No.: WO95/18495

PCT Pub. Date: Jul. 6, 1995

[30] Foreign Application Priority Data

Dec. 27, 1993 [NL] Netherlands ............... 9302266

[51] Int. Cl.[6] ............................................. H03M 13/00
[52] U.S. Cl. ........................... 341/94; 341/95; 341/51; 371/37.7; 371/47.1
[58] Field of Search ....................... 371/37.7, 47.1; 341/94, 51, 95

[56] References Cited

U.S. PATENT DOCUMENTS

| 5,155,487 | 10/1992 | Tanaka et al. | 341/100 |
| 5,267,249 | 11/1993 | Dong | 371/42 |
| 5,570,368 | 10/1996 | Murakami et al. | 370/94.2 |
| 5,619,516 | 4/1997 | Li et al. | 371/53 |

*Primary Examiner*—Jeffrey A. Gaffin
*Assistant Examiner*—Jason V. Kost
*Attorney, Agent, or Firm*—Michaelson & Wallace; Peter L. Michaelson

[57] ABSTRACT

A device for establishing boundaries in a bit stream is disclosed, which converts a first number of bits of the bit stream into a second number of bits (that is, the CRC is determined) and compares the second number of bits with a third number of bits of the bit stream. The converting means comprises discounting means for discounting the effect on the conversion process of at least one bit situated outside the first number of bits. The device establishes the boundary of the bit stream after a minimal time span, even for very high bit rates per bit shift.

10 Claims, 1 Drawing Sheet

DEVICE FOR ESTABLISHING CELL BOUNDARIES IN A BIT STREAM AND CRC CALCULATION

BACKGROUND OF THE INVENTION

The invention relates to a device for establishing boundaries in a bit stream (cell delineation), comprising converting means for converting a first number of bits of the bit stream into a second number of bits, which converting means comprise at least a first input for receiving at least one bit situated within the first number of bits and comprise at least a second input for receiving at least one bit situated outside the first number of bits, and comparing means for comparing the second number of bits with a third number of bits of the bit stream, which first number, second number and third number are each at least equal to one. Such a device is known from U.S. Pat. No. 5,131,012.

In general, if a boundary to be established is situated at a known distance from the first number of bits of the bit stream, the position of this boundary is known as soon as it has been established that the second number of bits agrees with the third number of bits of the bit stream. In this context said third number of bits is situated, for example, directly next to, or at a known distance from, the first number of bits, and at least until the boundary has been established, the conversion process and the subsequent comparison process should take place at regular intervals.

A bit stream defined, for example, in accordance with CCITT 1.432 4.5 consists of cells, each cell comprising 53 bytes of eight bits each. The problem of establishing cell boundaries in this bit stream, given a particular bit clock, is called "cell delineation" in technical terms. Each cell has a header which, for example, comprises five bytes. The conversion process in this case comprises the calculation of a cyclical redundancy code or CRC over the first four bytes (the first number of bits) of the header consisting of, for example, five bytes, which calculated CRC has a size of one byte (the second number of bits). The comparison process in this case comprises the mutual comparison of the calculated CRC (the second number of bits) and the fifth byte (the third number of bits) of the header consisting of, for example, five bytes. The calculation of the CRC is effected on the basis of a generator polynomial associated with the CRC, for example $G(x)=x^8+x^2+x+1$ (or 100000111). The first four bytes $U(x)$ are multiplied by $x^8$ (or padded on the right with 00000000), after which a division is carried out by $G(x)$, which yields a value $Q(x)$ and a remainder $R(x)$. The CRC over $U(x)$ is then equal to the remainder $R(x)$.

The calculation of the CRC over the first four bytes and the subsequent comparison of the calculated CRC with the fifth byte should take place at regular intervals. In principle this should be done by bit-shifting, which in the worst case affords the boundary to be established after 53 times eight minus 1 bit-shifts. As it is very difficult, however, if bit rates are very high (for example 600 Mbit/s), to carry out the said calculation of the CRC during one bit period, a different solution has been chosen. This different solution comprises the calculation, for each byte-shift, of the CRC over the first four bytes and the subsequent comparison of the calculated CRC with the fifth byte, which involves, after 57 byte-shifts and still no CRC corresponding to the fifth byte having been found, one bit-shift taking place, whereupon again at most 57 byte-shifts take place, each byte-shift again involving the calculation and the subsequent comparison, etc. In the worst case, this solution affords the boundary to be established after approximately eight times 57 byte-shifts, which means, with respect to the solution mentioned earlier, that on average somewhat more calculations and comparisons are required and, on average, the boundary is established only after a time span approximately eight times longer. On the other hand, however, eight times more time is available for one calculation and a subsequent comparison.

The drawback that the boundary can only be established after eight or more cells have been passed can be overcome at the hand of the device disclosed in U.S. Pat. No. 5,131,012. This device generates per bit-shift a new second number of bits as a function of a modified version of a previous second number of bits, a function term based on a set of bits situated outside the first number of bits, and a set of bits situated within the first number of bits. The device disclosed in U.S. Pat. No. 5,131,012 improves known synchronization methodology in a communications network to mitigate the problem of time involvement and to improve additional speed. However, when information is transmitted at a speed of for example 2 Gbit/s, the device disclosed in U.S. Pat. No. 5,131,012 cannot be used, because of the many calculations which, each time a bit has been dropped and another bit has been added, have to be made. So, the device disclosed in U.S. Pat. No. 5,131,012 is disadvantageous, inter alia, because of this device being impossible to use for high speed information transmission.

SUMMARY OF THE INVENTION

One of the objects of the invention is to provide a device of the type mentioned in the preamble, which can be used for high speed information transmission.

To this end, the device according to the invention is characterized in that the converting means comprise a series circuit of at least a fourth number of memory elements, each memory element for generating at least one bit of the second number of bits, which series circuit is coupled to the first input, and discounting means for discounting the effect on the conversion process of at least one bit situated outside the first number of bits, which discounting means are coupled to the second input and to the series circuit.

By means of the device according to the invention, for each bit-shift the conversion of the first number of bits into the second number of bits is determined (that is, the CRC is determined) but not by a complete conversion being carried out (a complete CRC being calculated) anew each time, but by, after a bit-shift, only the effect of a bit most recently shifted in and of a bit just shifted out on a previous conversion (a previous CRC) being determined, via the series circuit and the discounting means.

The problem that known devices cannot be used for high speed information transmission is solved by this invention, because as a consequence of using the series circuit of memory elements in combination with the discounting means which couple the second input to one or more of these memory elements, the maximum possible speed of the information transmission is only limited by the delay time of the slowest memory element and/or by the delay time of the slowest coupling between the second input and one of the memory elements (which coupling is a part of the discounting means).

The fourth number (of memory elements) will generally be equal to the second and the third number (of bits).

The invention is based, inter alia, on the insight that in this kind of device all calculations should be avoided.

A first embodiment of the device according to the invention is characterized in that the series circuit is a feedback series circuit comprising at least one combining device for coupling an output of a last memory element and the first input to an input of a first memory element.

Via the combining device, the feedback mentioned earlier is implemented.

A second embodiment of the device according to the invention is characterized in that the discounting means comprise at least one further combining device for coupling an output of a memory element and the second input to an input of a further memory element.

Via the further combining device, the discounting process mentioned earlier is implemented.

A third and simple embodiment of the device according to the invention is characterized in that the memory elements comprise flip-flop circuits and the combining devices comprise modulo-two adders.

A fourth embodiment, represented in great detail, of the device according to the invention is characterized in that the converting means comprise a first combining device of which a first input is coupled to the first input of the converting means and of which a second input is coupled to an output of an eighth memory element, of which eighth memory element an input is coupled to an output of a seventh memory element, of which seventh memory element an input is coupled to an output of a sixth combining device, of which a first input is coupled to an output of a sixth memory element and of which second input is coupled to the second input of the converting means, of which sixth memory element an input is coupled to an output of a fifth combining device, of which a first input is coupled to an output of a fifth memory element and of which a second input is coupled to the second input of the converting means, of which fifth memory element an input is coupled to an output of a fourth memory element, of which fourth memory element an input is coupled to an output of a third memory element, of which third memory element an input is coupled to an output of a fourth combining device, of which a first input is coupled to an output of a second memory element and of which a second input is coupled to an output of the first combining device, of which second memory element an input is coupled to an output of a third combining device, of which a first input is coupled to an output of a second combining device and of which a second input is coupled to the second input of the converting means, of which second combining device a first input is coupled to an output of a first memory element and a second input is coupled to the output of the first combining device, of which first memory element an input is coupled to the output of the first combining device, the eight outputs of the memory elements each being coupled to one of the at least eight outputs of the converting means.

The invention further relates to converting means for use in a device for establishing boundaries in a bit stream, which converting means convert a first number of bits of the bit stream into a second number of bits, and which converting means comprise at least a first input for receiving at least one bit situated within the first number of bits and comprise at least a second input for receiving at least one bit situated outside the first number of bits, which first number and second number are each at least equal to one.

The converting means according to the invention are characterized in that the converting means comprise
- a series circuit of at least a fourth number of memory elements, each memory element for generating at least one bit of the second number of bits, which series circuit is coupled to the first input, and
- discounting means for discounting the effect on the conversion process of at least one bit situated outside the first number of bits, which discounting means are coupled to the second input and to the series circuit.

A first embodiment of the converting means according to the invention is characterized in that the series circuit is a feedback series circuit comprising at least one combining device for coupling an output of a last memory element and the first input to an input of a first memory element.

A second embodiment of the converting means according to the invention is characterized in that the discounting means comprise at least one further combining device for coupling an output of a memory element and the second input to an input of a further memory element.

A third and simple embodiment of the converting means according to the invention is characterized in that the memory elements comprise flip-flop circuits and the combining devices comprise modulo-two adders.

A fourth embodiment, represented in great detail, of the converting means according to the invention is characterized in that the converting means comprise a first combining device of which a first input is coupled to the first input of the converting means and of which a second input is coupled to an output of an eighth memory element, of which eighth memory element an input is coupled to an output of a seventh memory element, of which seventh memory element an input is coupled to an output of a sixth combining device, of which a first input is coupled to an output of a sixth memory element and of which a second input is coupled to the second input of the converting means, of which sixth memory element an input is coupled to an output of a fifth combining device, of which a first input is coupled to an output of a fifth memory element and of which a second input is coupled to the second input of the converting means, of which fifth memory element an input is coupled to an output of a fourth memory element, of which fourth memory element an input is coupled to an output of a third memory element, of which third memory element an input is coupled to an output of a fourth combining device, of which a first input is coupled to an output of a second memory element and of which a second input is coupled to an output of the first combining device, of which second memory element an input is coupled to an output of a third combining device, of which a first input is coupled to an output of a second combining device and of which a second input is coupled to the second input of the converting means, of which second combining device a first input is coupled to an output of a first memory element and a second input is coupled to the output of the first combining device, of which first memory element an input is coupled to the output of the first combining device, the eight outputs of the memory elements each being coupled to one of the at least eight outputs of the converting means.

It should be noted that the feedback series circuit without the discounting means is known per se from HDLC (high level data link control) techniques for calculating a CRC over, for example, 32 bits, by successively shifting these 32 bits into the feedback series circuit. It is the case, however, for these HDLC techniques the byte-boundaries and/or cell boundaries in the bit stream are already known in advance and are indicated by a flag (that is, a unique bit pattern which does not occur at any other point in the bit stream) Because the byte and/or cell boundaries are known it is possible, after one byte boundary and/or cell boundary has been detected, for the 32 bits to be shifted into the feedback series circuit, which after the last of the 32 bits have been shifted in directly affords the CRC of 8 bits which should be compared with the CRC to be formed by the next 8 bits. For ATM techniques, where boundaries in the bit stream are absolutely not known and/or predictable, the bare feedback series circuit without additions is therefore not of much use, since for each new bit all the 31 adjacent bits would also have to be shifted into the feedback series circuit, and for each new bit said new bit together with the adjacent 31 bits could afford a CRC. The invention is further based, inter alia, on the insight that the feedback series circuit is indeed of use for ATM techniques and thus for establishing boundaries in a bit stream, if the effect of the bit which does not belong to the 32 bits and is adjacent to said 32 bits, is discounted for each bit newly shifted in.

A system for inserting codewords at the sending side and for detecting these codewords on the receiving side is specified in AU-B-58011/90. Another method for establishing boundaries in an ATM bit stream is specified in AU-A-77042/91. A CRC calculation apparatus which can calculate CRC checkbits on 8 bits of raw input data per cycle of a group clock is disclosed in EP-A-O 226 353. This apparatus does not include converting means comprising at least a first input for receiving at least one bit situated within the first number of bits and comprising at least a second input for receiving at least one bit situated outside the first number of bits. In the device according to the invention the converting means comprise a series circuit, while the CRC calculation apparatus disclosed in EP-A-O 226353 comprises parallel circuits. Therefore, compared with the device according to the invention, the CRC calculation apparatus disclosed in EP-A-O 226 353 is based on a completely different technology.

References

CCITT 1.432 4

AU-A-77042/91

AU-B-S8011/90

U.S. Pat. No. 5,131,012

EP-A-O 226 353

All the references are hereby considered to be incorporated in the present application.

SPECIFIC EMBODIMENT

The invention will be explained in more detail with reference to a specific embodiment depicted in the figure, in which:

FIG. 1 shows a device according to the invention, comprising converting means according to the invention.

The device according to the invention, depicted in FIG. 1, comprises converting means 10, comparing means 27 and a shift register 30. Converting means 10 are equipped with an input 19 and a further input 20, with eight memory elements 11, 12, 13, 14, 15, 16, 17 and 18, and with six combining devices 21, 22, 23, 24, 25 and 26.

Converting means 10 thus comprise a first combining device 21 of which a first input is coupled to an input 19 of converting means 10 and of which a second input is coupled to an output of an eighth memory element 18, of which eighth memory element 18 an input is coupled to an output of a seventh memory element 17, of which seventh memory element 17 an input is coupled to an output of a sixth combining device 26, of which a first input is coupled to an output of a sixth memory element 16 and of which a second input is coupled to further input 20 of convening means 10, of which sixth memory element 16 an input is coupled to an output of a fifth combining device 25, of which a first input is coupled to an output of a fifth memory element 15 and of which a second input is coupled to further input 20 of the converting means 10, of which fifth memory element 15 an input is coupled to an output of a fourth memory element 14, of which fourth memory element 14 an input is coupled to an output of a third memory element 13, of which third memory element 13 an input is coupled to an output of a fourth combining device 24, of which a first input is coupled to an output of a second memory element 12 and of which a second input is coupled to an output of first combining device 21, of which second memory element 12 an input is coupled to an output of a third combining device 23, of which a first input is coupled to an output of a second combining device 22 and of which a second input is coupled to further input 20 of converting means 10, of which second combining device 22 a first input is coupled to an output of a first memory element 11 and a second input is coupled to the output of first combining device 21, of which first memory element 11 an input is coupled to the output of first combining device 21, the eight outputs of the memory elements 11 to 18 inclusive each being coupled to one of the eight outputs of converting means 10.

These eight outputs of converting means 10 are each connected to one of the eight one inputs of comparing means 27, which are further equipped with an output 28. Shift register 30 comprises forty memory sections 31 to 70 inclusive, and an input 29. The eight outputs of memory sections 31 to 38 inclusive are each connected to one of the eight other inputs of comparing means 27. The output of memory section 38 is coupled to input 19, and the output of memory section 70 is coupled to further input 20 of converting means 10.

The bit stream in which a boundary is to be established, is fed to input 29 of shift register 30. Memory sections 31 to 38 inclusive contain the third number of bits, in this case eight bits (one byte), which are fed to comparing means 27. On the outputs of converting means 10 there appears the second number of bits, in this case eight bits (one byte), which are likewise fed to comparing means 27. As soon as the second number of bits and the third number of bits agree with one another, comparing means 27 generate a synchronization signal via output 28. Memory sections 39 to 70 inclusive contain the first number of bits, in this case thirty-two bits (four bytes) which are converted by converting means 10 to the second number of bits. It should be noted in this context that converting means 10 do not process the bits present on inputs 19 and 20 until after one clock pulse period (because of the presence of the memory elements), which affects the choice of the bits to be fed to inputs 19 and 20. This is because during one earlier clock pulse period the first number of bits is located in memory sections 38 to 69 inclusive, and the at least one bit situated outside the first number of bits (the thirty-third bit) is located in memory section 70.

This conversion process has hitherto been effected by calculating a CRC (Cyclical Redundancy Code) over the first number of bits on the basis of a generator polynomial associated with the CRC, for example $G(x)=x^8+x^2+x+1$ (or 100000111). The first number of bits, that is the first four bytes $U(x)$, are multiplied by $x^8$ (or padded with 00000000 on the Least-Significant-Bit side), after which a division is carried out by $G(x)$, which yields a value $Q(x)$ and a remainder $R(x)$. The CRC over $U(x)$ is then equal to the remainder $R(x)$. Said remainder $it(x)$ corresponds to the second number of bits.

According to the invention, the conversion process is now effected by only one bit of the first number of bits, namely the bit present in memory section 38 (during one earlier clock pulse period), being fed to input 19 of converting means 10 and by a bit situated outside the first number of bits, namely the bit stored in memory section 70 (during one earlier clock pulse period) being fed to input 20 of converting means 10. Partly as a result of discounting means 23, 25 and 26 (three combining devices) being employed, converting means 10 generate exactly the same result as converting means known hitherto, which perform the complete CRC calculation mentioned previously on the basis of the generator polynomial associated with the CRC. It will obviously be necessary, if a different polynomial is used, for the converting means in general and the discounting means in particular to be of different construction in order again to be able to generate the same result as converting means known hitherto, which perform the complete CRC calculation mentioned previously on the basis of the other generator polynomial.

The eight memory elements of converting means 10 form a feedback series circuit of a fourth number of memory elements, which fourth number in this case is therefore equal to eight. The six combining devices are located in this series circuit. This series circuit comprises combining device 21 for coupling memory element 11 to input 19 of converting means 10 for receiving at least one bit situated within the first number of bits, and to memory element 18. This series circuit further comprises combining devices 23, 25 and 26, respectively, for coupling memory elements 12, 16 arid 17, respectively, to further input 20 of converting means 10 (for receiving at least one bit situated outside the first number of bits) and to memory elements 11, 15 and 16, respectively. The memory elements are formed, for example, by flip-flop circuits, and the combining devices are formed, for example, by modulo-two adders or EXOR gates.

The operation of converting means 10 will be explained in more detail with reference to the following. Without the use of discounting means 23, 25 and 26 and further input 20, converting means 10 generate the CRC on the basis of the generator polynomial $G(x)=x8+x2+x+1$ (or 100000111) of precisely thirty-two bits $U(x)$ shifted in, which otherwise are multiplied to this end by x8 (or padded with 00000000on the Least-Significant-Bit side), after which a division is carried out by $G(x)$, which yields a value $Q(x)$ and a remainder $R(x)$, which remainder it(x) corresponds to the CRC. All this is easily proved by mathematical induction in a manner known to those skilled in the art. If then a subsequent bit is shifted in via input 29 of shift register 30, there appears on the eight outputs of converting means 10 a CRC of not thirty-two but of thirty-three bits which is obviously undesirable. The effect of the thirty-third bit (during one further clock pulse period present in memory section 70) therefore should be discounted. This is done thanks to the use of discounting means 23, 25 and 26, specifically as follows.

Because polynomial divisions are linear operations, the effect of the thirty-third bit can be determined in a simple manner by determining its canonical pattern. This is done by the thirty-third bit, padded with thirty-two zeros (that is 1000000000000000000000000000000000) being multiplied by $x^8$ (that is, padding with eight zeros or 00000000 on the Least-Significant-Bit side), after which it is divided by $G(x)$ (that is, 100000111), which yields a value $Q(x)$ and a remainder $R(x)$ (that is, 01100010). Said remainder $R(x)$ is the canonical pattern which, after having been multiplied by the bit value of the thirty-third bit tone or zero) should be deducted in the conversion process. Since in terms of modulo-two deduction corresponds to modulo-two addition, the bit present in memory section 70 should therefore be fed, via three modulo-two adders, 23, 25 and 26, respectively, to the second memory element 12 (because of 01100010), the sixth memory element 16 (because of 01100010) and the seventh memory element 17 (because of 01100010), respectively. Thus the effect of the thirty-third bit has thereby been deducted during the conversion process, as a result of which the correct CRC will after all appear on the eight outputs of converting means 10.

It should again be emphasized that if a different polynomial and/or different first, second and/or third numbers of bits are used the construction of the device shown in the figure will change. The invention is therefore not restricted to the specific embodiment shown, but comprises both any devices for establishing boundaries which are provided with discounting means and any converting means which belong to these devices and are provided with discounting means.

We claim:

1. Device for establishing boundaries in a bit stream, comprising converting means (10) for converting a first number of bits of the bit stream into a second number of bits, which converting means (10) comprise at least a first input (19) for receiving at least one bit situated within the first number of bits and comprise at least a second input (20) for receiving at least one bit situated outside the first number of bits, and comparing means (27) for comparing the second number of bits with a third number of bits of the bit stream, which first number, second number and third number are each at least equal to one, characterized in that the converting means (10) comprise a series circuit (11–18) of at least a fourth number of memory elements, each memory element for generating at least one bit of the second number of bits, which series circuit (11–18) is coupled to the first input (19), and discounting means (23,25,26) for discounting the effect on the conversion process of at least one bit situated outside the first number of bits, which discounting means (23,25,26) are coupled to the second input (20) and to the series circuit (11–18).

2. Device according to claim 1, characterized in that the series circuit (11–18) is a feedback series circuit (11–18,21, 22,24) comprising at least one combining device (21) for coupling an output of a last memory element (18) and the first input (19) to an input of a first memory element (11).

3. Device according to claim 1, characterized in that the discounting means (23,25,26) comprise at least one further combining device for coupling an output of a memory element (11,15,16) and the second input (20) to an input of a further memory element (12,16,17).

4. Device according to claim 1, characterized in that the memory elements (11–18) comprise flip-flop circuits and the combining devices (21–26) comprise modulo-two adders.

5. Device according to claim 1, characterized in that the converting means (10) comprise a first combining device (21) of which a first input is coupled to the first input (19) of the converting means (10) and of which a second input is coupled to an output of an eighth memory element (18), of which eighth memory element (18) an input is coupled to an output of a seventh memory element (17), of which seventh memory element (17) an input is coupled to an output of a sixth combining device (26), of which a first input is coupled to an output of a sixth memory element (16) and of which a second input is coupled to the second input (20) of the converting means (10), of which sixth memory element (16) an input is coupled to an output of a fifth combining device (25), of which a first input is coupled to an output of a fifth memory element (15) and of which a second input is coupled to the second input (20) of the converting means (10), of which fifth memory element (15) an input is coupled to an output of a fourth memory element (14), of which fourth memory element (14) an input is coupled to an output of a third memory element (13), of which third memory element (13) an input is coupled to an output of a third combining device (24), of which a first input is coupled to an output of a second memory element (12) and of which a second input is coupled to an output of the first combining device (21), of which second memory element (12) an input is coupled to an output of a third combining device (23), of which a first input is coupled to an output of a second combining device (22) and of which a second input is coupled to the second input (20) of the converting means (10), of which second combining device (22) a first input is coupled to an output of a first memory element (11) and a second input is coupled to the output of the first combining device (21), of which first memory element (11) an input is coupled to the output of the first combining device (21), the eight outputs of the memory elements (11–18) each being coupled to one of the at least eight outputs of the converting means (10).

6. Converting means (10) for use in a device for establishing boundaries in a bit stream, which converting means (10) convert a first number of bits of the bit stream into a second number of bits, and which converting means (10) comprise at least a first input (19) for receiving at least one bit situated within the first number of bits and comprise at least a second input (20) for receiving at least one bit situated outside the first number of bits, which first number and second number are each at least equal to one, characterized in that the converting means (10) comprise a series circuit (11–18) of at least a fourth number of memory elements, each memory element for generating at least one bit of the second number of bits, which series circuit (11–18) is coupled to the first input (19), and discounting means (23,25,26) for discounting the effect on the conversion process of at least one bit situated outside the first number of bits, which discounting means (23,25,26) are coupled to the second input (20) and to the series circuit (11–18).

7. Converting means (10) according to claim 6, characterized in that the series circuit (11–18) is a feedback series circuit (11–18,21,22,24) comprising at least one combining device (21) for coupling an output of a last memory element (18) and the first input (19) to an input of a first memory element (11).

8. Converting means (10) according to claim 6, characterized in that the discounting means (23,25,26) comprise at least one further combining device for coupling an output of a memory element (11,15,16) and the second input (20) to an input of a further memory element (12,16,17).

9. Converting means (10) according to claim 6, characterized in that the memory elements (11–18) comprise flip-flop circuits and the combining devices (21–26) comprise modulo-two adders.

10. Converting means (10) according to claim 6 inclusive, characterized in that the converting means (10) comprise a first combining device (21) of which a first input is coupled to the first input (19) of the converting means (10) and of which a second input is coupled to an output of an eighth memory element (18), of which eighth memory element (18) an input is coupled to an output of a seventh memory element (17), of which seventh memory element (17) an input is coupled to an output of a sixth combining device (26), of which a first input is coupled to an output of a sixth memory element (16) and of which a second input is coupled to the second input (20) of the converting means (10), of which sixth memory element (16) an input is coupled to an output of a fifth combining device (25), of which a first input is coupled to an output of a fifth memory element (15) and of which a second input is coupled to the second input (20) of the converting means (10), of which fifth memory element (15) an input is coupled to an output of a fourth memory element (14), of which fourth memory element (14) an input is coupled to an output of a third memory element (13), of which third memory element (13) an input is coupled to an output of a fourth combining device (24), of which a first input is coupled to an output of a second memory element (12) and of which a second input is coupled to an output of the first combining device (21), of which second memory element (12) an input is coupled to an output of a third combining device (23), of which a first input is coupled to an output of a second combining device (22) and of which a second input is coupled to the second input (20) of the converting means (10), of which second combining device (22) a first input is coupled to an output of a first memory element (11) and a second input is coupled to the output of the first combining device (21), of which first memory element (11) an input is coupled to the output of the first combining device (21), the eight outputs of the memory elements (11–18) each being coupled to one of the at least eight outputs of the converting means (10).

* * * * *